United States Patent [19]

Brady et al.

[11] Patent Number: 6,121,878
[45] Date of Patent: *Sep. 19, 2000

[54] SYSTEM FOR CONTROLLING ASSETS

[75] Inventors: Michael John Brady, Brewster; Dah-Weih Duan, Yorktown Heights; Harley Kent Heinrich, Brewster; Venkata S. R. Kodukula, Yorktown Heights, all of N.Y.

[73] Assignee: Intermec IP Corp., Woodland Hills, Calif.

[*] Notice: This patent is subject to a terminal disclaimer.

[21] Appl. No.: 09/190,564

[22] Filed: Nov. 12, 1998

Related U.S. Application Data

[63] Continuation of application No. 09/071,413, May 1, 1998, Pat. No. 5,939,984.
[60] Provisional application No. 60/102,476, Sep. 30, 1998, and provisional application No. 60/093,088, Jul. 16, 1998.

[51] Int. Cl.[7] .................................................. G08B 13/14
[52] U.S. Cl. ................................. 340/572.1; 340/572.2; 340/572.6; 340/568.1; 340/825.54
[58] Field of Search .............................. 340/572.1, 568.1, 340/572.2, 572.7, 572.8, 539, 547, 825.54, 572.5, 572.6

[56] References Cited

U.S. PATENT DOCUMENTS

| | | | |
|---|---|---|---|
| 4,075,632 | 2/1978 | Baldwin et al. | 343/6.8 R |
| 4,360,810 | 11/1982 | Landt | 343/6.5 R |
| 4,660,025 | 4/1987 | Humphrey | 340/572.1 |
| 4,782,345 | 11/1988 | Landt | 343/727 |
| 4,786,907 | 11/1988 | Koelle | 342/51 |
| 4,816,389 | 3/1989 | Sansonetti et al. | 435/6 |
| 4,835,377 | 5/1989 | Brown | 235/492 |
| 4,853,705 | 8/1989 | Landt | 343/803 |
| 4,864,158 | 9/1989 | Koelle et al. | 307/231 |
| 4,888,579 | 12/1989 | ReMine et al. | 340/572.1 |
| 4,888,591 | 12/1989 | Landt et al. | 342/44 |
| 4,940,966 | 7/1990 | Pettigrew et al. | 340/551 |
| 4,980,670 | 12/1990 | Humphrey et al. | 340/551 |
| 4,999,636 | 3/1991 | Landt et al. | 342/90 |
| 5,030,807 | 7/1991 | Landt et al. | 235/375 |
| 5,055,659 | 10/1991 | Hendrick et al. | 235/439 |
| 5,175,419 | 12/1992 | Yamashita | 235/449 |
| 5,181,020 | 1/1993 | Furukawa et al. | 340/551 |
| 5,313,192 | 5/1994 | Ho et al. | 340/551 |
| 5,392,028 | 2/1995 | Pichl | 340/572.5 |
| 5,414,410 | 5/1995 | Davies et al. | 340/551 |
| 5,450,492 | 9/1995 | Hook et al. | 380/28 |
| 5,479,160 | 12/1995 | Koelle | 340/825.7 |
| 5,485,520 | 1/1996 | Chaum et al. | 380/24 |
| 5,504,485 | 4/1996 | Landt et al. | 342/42 |
| 5,510,795 | 4/1996 | Koelle | 342/114 |
| 5,521,601 | 5/1996 | Kandlur et al. | 342/44 |
| 5,528,222 | 6/1996 | Moskowitz et al. | 340/572.1 |
| 5,538,803 | 7/1996 | Gambino et al. | 428/684 TM |
| 5,550,547 | 8/1996 | Chan et al. | 342/42 |
| 5,552,778 | 9/1996 | Schrott et al. | 340/825.34 |
| 5,554,974 | 9/1996 | Brady et al. | 340/572.1 |

(List continued on next page.)

FOREIGN PATENT DOCUMENTS

| | | |
|---|---|---|
| 0 294 963 | 12/1988 | European Pat. Off. . |
| 0 646 983 | 4/1995 | European Pat. Off. . |
| WO 98/16070 | 4/1998 | WIPO . |

OTHER PUBLICATIONS

"Multifunction Credit Card Package" IBM Technical Disclosure Bulletin, vol. 38, No. 08, Aug. 1995, p. 17.

"A Low–Power CMOS Integrated Circuit for Field–Powered Radio Frequency Identification Tag" By Friedman et al., 1997 IEEE International Solid State Circuits Conference, Paper SA 17.5, pp. 294, 295, 474.

*Primary Examiner*—Jeffery A. Hofsass
*Assistant Examiner*—Toan Pham
*Attorney, Agent, or Firm*—O'Melveny & Myers LLP

[57] ABSTRACT

A system for controlling assets for inventory, loss-control, or monitoring. The system includes a combination RFID and EAS tag and a reader.

20 Claims, 10 Drawing Sheets

U.S. PATENT DOCUMENTS

| | | | |
|---|---|---|---|
| 5,563,583 | 10/1996 | Brady et al. | 340/572.1 |
| 5,565,847 | 10/1996 | Gambino et al. | 340/572.1 |
| 5,606,323 | 2/1997 | Heinrich et al. | 342/51 |
| 5,635,693 | 6/1997 | Benson et al. | 235/384 |
| 5,654,693 | 8/1997 | Cocita | 340/572.1 |
| 5,673,037 | 9/1997 | Cesar et al. | 340/825.54 |
| 5,680,106 | 10/1997 | Schrott et al. | 340/572.1 |
| 5,682,143 | 10/1997 | Brady et al. | 340/572.1 |
| 5,729,201 | 3/1998 | Jahnes et al. | 340/572.1 |
| 5,729,697 | 3/1998 | Schkolnick et al. | 395/223 |
| 5,736,929 | 4/1998 | Schrott et al. | 340/572.1 |
| 5,737,710 | 4/1998 | Anthonyson | 701/1 |
| 5,739,754 | 4/1998 | Schrott et al. | 340/572.1 |
| 5,767,789 | 6/1998 | Afzali-Ardakani et al. | 340/825.54 |
| 5,771,021 | 6/1998 | Veghte et al. | 343/700 MS |
| 5,777,561 | 7/1998 | Chieu et al. | 340/825.54 |
| 5,786,626 | 7/1998 | Brady et al. | 257/673 |
| 5,812,065 | 9/1998 | Schrott et al. | 340/825.54 |
| 5,821,859 | 10/1998 | Schrott et al. | 340/572.1 |
| 5,825,329 | 10/1998 | Veghte et al. | 343/700 MS |
| 5,826,328 | 10/1998 | Brady et al. | 24/827 |
| 5,828,318 | 10/1998 | Cesar | 340/825.69 |
| 5,828,693 | 10/1998 | Mays et al. | 375/202 |
| 5,831,532 | 11/1998 | Gambino et al. | 340/572.1 |
| 5,850,181 | 12/1998 | Heinrich et al. | 340/825.54 |
| 5,850,187 | 12/1998 | Heinrich et al. | 340/572.1 |
| 5,859,587 | 1/1999 | Alicot et al. | 340/572.1 |
| 5,874,896 | 2/1999 | Lowe et al. | 340/572.1 |
| 5,874,902 | 2/1999 | Heinrich et al. | 340/825.54 |
| 5,914,862 | 6/1999 | Ferguson et al. | 361/737 |
| 5,939,984 | 8/1999 | Brady et al. | 340/572.1 |
| 5,942,978 | 8/1999 | Shafer | 340/572.9 |
| 5,955,951 | 9/1999 | Wischerop et al. | 340/572.8 |

SYSTEM FOR CONTROLLING ASSETS

CROSS-REFERENCE TO RELATED APPLICATIONS

This application claims benefit of provisonal application Ser. No. 60/102/476 filed Sep. 30, 1998 which is a provisional of Ser. No. 60/093,088 filed Jul. 16, 1998 which is a continuation of Ser. No. 09/071,413 filed May 1, 1998, now U.S. Pat. No. 5,939,984 herein by reference in their entirety:

U.S. patents

| U.S. Pat. No. | Issue Date | Filing Date | Attorney Docket No |
| --- | --- | --- | --- |
| 5,521,601 | 05/28/96 | 04/21/95 | YO995-0088 |
| 5,528,222 | 06/18/96 | 09/09/94 | YO994-180 |
| 5,538,803 | 07/23/96 | 11/23/94 | YO994-0073 |
| 5,550,547 | 08/27/96 | 09/12/94 | YO994-185 |
| 5,552,778 | 09/03/96 | 11/23/94 | YO994-0232 |
| 5,554,974 | 09/10/96 | 11/23/94 | YO994-0071 |
| 5,563,583 | 10/08/96 | 11/23/94 | YO994-070 |
| 5,565,847 | 10/15/96 | 11/23/94 | YO994-0072 |
| 5,606,323 | 02/25/97 | 08/31/95 | YO995-157 |
| 5,635,693 | 06/03/97 | 02/02/95 | YO994-0215 |
| 5,673,037 | 09/30/97 | 09/09/94 | YO994-184 |
| 5,680,106 | 10/21/97 | 10/27/95 | YO995-0219 |
| 5,682,143 | 10/28/97 | 09/09/94 | YO994-170 |
| 5,729,201 | 03/17/98 | 06/29/95 | YO995-109 |
| 5,729,697 | 03/17/98 | 04/24/95 | YO995-076 |
| 5,736,929 | 04/07/98 | 06/07/96 | YO996-085 |
| 5,739,754 | 04/14/98 | 07/29/96 | YO996-115 |
| 5,767,789 | 06/16/98 | 08/31/95 | YO994-213 |
| 5,777,561 | 07/07/98 | 09/30/96 | YO996-178 |
| 5,786,626 | 07/28/98 | 03/25/96 | YO996-031 |
| 5,812,065 | 09/22/98 | 12/08/95 | YO995-124X |
| 5,821,859 | 10/13/98 | 06/07/96 | YO996-084 |

U.S. Nonprovisional Patent Applications

| Application No | Filing Date | Attorney Docket No |
| --- | --- | --- |
| 08/681,741 | 07/29/96 | YO996-037 |
| 08/626,820 | 04/03/96 | YO995-158 |
| 08/646,539 | 05/08/96 | YO996-068 |
| 08/681,741 | 07/29/96 | YO996-037 |
| 08/694,606 | 08/09/96 | YO995-218 |
| 08/790,639 | 01/29/97 | YO997-024 |
| 08/790,640 | 01/29/97 | YO997-023 |
| 08/733,684 | 10/17/96 | YO996-195 |
| 08/862,149 | 05/23/97 | YO997-116 |
| 08/862,912 | 05/23/97 | YO997-115 |
| 08/862,913 | 05/23/97 | YO997-114 |
| 08/909,719 | 08/12/97 | YO995-109B (allowed) |
| 08/935,989 | 10/23/97 | YO997-310 |
| EH 372 217 464 US | 07/10/98 | YO896-0212R1 |
| 09/122,300 | 07/24/98 | YO897-259R |

U.S. Provisional Patent Applications

| Application No | Filing Date | Attorney Docket No |
| --- | --- | --- |
| 60/068,373 | 12/22/97 | YO894-0206P1 |
| 60/073,102 | 01/30/98 | YO897-0028P1 |
| 60/074,605 | 02/13/98 | YO897-0259P1 |
| 60/077,879 | 03/13/98 | YO997-0038P1 |
| 60/078,100 | 03/16/98 | YO897-0657P1 |
| 60/078,226 | 03/16/98 | YO897-0658P1 |
| 60/078,287 | 03/17/98 | YO897-0661P1 |
| 60/091,350 | 07/01/98 | YO897-0259P2 |
| 60/078,304 | 03/17/98 | YO897-0662P1 |
| 60/090,637 | 06/25/98 | YO896-0212P2 |
| 60/091,352 | 07/01/98 | YO897-0673P1 |
| 60/091,350 | 07/01/98 | YO897-0259P2 |
| 60/093,088 | 07/16/98 | 38384P1 |
| 60/099,298 | 09/04/98 | YO894-0206P3 |
| EI 837 644 898 US | 09/17/98 | 38402P1 |

The following further documents are also incorporated herein by reference in their entirety:

IBM Technical Disclosure Bulletin

IBM Technical Disclosure Bulletin: Vol. 38 No 08, Aug. 1995, page 17, "Multifunction Credit Card Package," by Brady, Moskowitz, and Murphy (published pseudonymously).

Literature Reference

D. Friedman, H. Heinrich, D. Duan, "A low-power CMOS integrated circuit for field-powered radio frequency identification (RFID) tags," 1997 Digest of Technical Papers of the IEEE International Solid-State Circuits Conference (ISSCC), San Francisco, Calif., February 1997.

PCT Published International Applications

| Application No | Filing Date | Attorney Docket No |
| --- | --- | --- |
| PCT/GB96/00061 | 01/15/96 | UK 9-94-066 PCT |
| PCT/EP95/03703 | 10/20/95 | YO994-242 PCT |

UK Published Application

| Application No | Filing Date | Attorney Docket No |
| --- | --- | --- |
| 9710025.9 | 05/19/97 | YO9-96-084 |

FIELD OF THE INVENTION

The present invention relates to an identification tag and more particularly to an identification tag having a large number of bits of information, where the identification tag has an electronic article surveillance function which is difficult to defeat.

DESCRIPTION OF THE RELATED ART

Radio Frequency Identification (RFID) provides wireless, non-contact interrogation of multiple bit transponders. Such transponders may be beneficially utilized to identify chattels. RFID systems generally include at least one transponder and a transmitter for transponder communication. Radio frequency identification transponders (RFID Tags) have recently been developed having a single silicon chip attached to an antenna.

Since RFID transponders are beneficially utilized to identify chattels it is desirable to utilize such transponders in anti-theft systems. However, RFID transponders may be shielded from their radio link. Thus, the asset control utility of RFID transponders has an inherent Achillies heel. Therefore, it would be desirable to provide a countermeasure to this vulnerability.

Magnetic electronic article surveillance (EAS) tags are much less easily shielded from low frequency magnetic detection fields. Such tags, however, are only capable of storing a few bits.

Some conventional magnetic EAS tags have employed the Barkhausen jump effect. Generally, the Barkhausen effect is characterized by a tendency for magnetization induced in a magnetic material to change in discrete steps as an external magnetic field is increased or decreased. (The material is said to be a non-linear magnetic material if the magnetization of the material is not proportional to the external magnetic field.) A large temporal flux change, df./dt, occurs when such a step takes place, and a sizable voltage may be induced in a sensing or pickup coil.

For example, U.S. Pat. No. 5,181,020 describes a thin-film magnetic tag having a magnetic thin film formed on a polymer substrate and a method for producing the same. The thin film exhibits a large Barkhausen discontinuity without intentional application of external torsional or tensile stress on use. A particular disclosed use is as a marker or tag for use in an article surveillance system wherein articles may be identified by interrogating the tagged article in a cyclic magnetic field of a predetermined frequency in a surveillance area and detecting a harmonic wave of the magnetic field generated by the tag in the surveillance area. This conventional system is only a single bit element using a single Barkhausen layer with no ability to develop a code to distinguish items.

U.S. Pat. No. 5,313,192 describes another single bit tag which relies on the Barkhausen effect. The tag of this invention is selected to include a first component comprised of a soft magnetic material which constitutes the bulk of the tag. A second component comprised of a semi-hard or hard magnetic material is integral with the first component. The tag is conditioned such that the second component has activating and deactivating states for placing the tag in active and deactivated states, respectively. Such conditioning includes subjecting the composite tag to predetermined magnetic fields during thermal processing stages. By switching the second component between its activating and deactivating states the tag can be switched between its active and de-active states. A reusable tag with desired step changes in flux which is capable of deactivation and reactivation is thereby realized.

U.S. Pat. No. 4,980,670 describes a one bit magnetic tag formed from a magnetic material having domains with a pinned wall configuration. The resulting hysteresis characteristic for that material is such that upon subjecting the material to an applied alternating magnetic field, the magnetic flux of the material undergoes a regenerative step change in flux (Barkhausen jump) at a threshold value when the field increases to the threshold value from substantially zero and undergoes a gradual change in flux when the field decreases from the threshold value to substantially zero. For increasing values of applied field below the threshold, there is substantially no change in the magnetic flux of the material. The tag may be deactivated by preventing the domain walls from returning to their pinned condition by, for example, application of a field of sufficiently high frequency and/or amplitude.

U.S. Pat. No. 4,940,966 describes the use of a plurality of magnetic elements in predetermined associations (e.g. with predetermined numbers of magnetic elements and with predetermined spacings between said elements), for identifying or locating preselected categories of articles. When the articles are caused to move relative to a predetermined interrogating magnetic field, each particular association of magnetic elements gives rise to a magnetic signature whereby the article or category of article carrying each of the predetermined associations can be recognized and/or located.

U.S. Pat. No. 4,660,025 describes a marker for use in an electronic surveillance system. The marker, which can be in the form of a wire or strip of magnetic amorphous metal, is characterized by having retained stress and a magnetic hysteresis loop with a large Barkhausen discontinuity. When the marker is exposed to an external magnetic field whose field strength, in the direction opposing the instantaneous magnetic polarization of the marker, exceeds a predetermined threshold value, a regenerative reversal of the magnetic polarization of the marker occurs and results in the generation of a harmonically rich pulse that is readily detected and easily distinguished.

U.S. Pat. No. 5,175,419 describes a method for interrogating an identification tag comprised of a plurality of magnetic, thin wires or thin bands which have highly rectangular hysteresis curves and different coercive forces. The wires or bands are preferably of amorphous material, but means for obtaining the highly rectangular hysteresis curves and different coercive forces are not taught; nor is the concept taught of using a time varying magnetic field superimposed on a ramp field for interrogation.

U.S. Pat. No. 5,729,201 describes an inexpensive multi-bit magnetic tag which uses an array of amorphous wires in conjunction with a magnetic bias field. The tag is interrogated by the use of a ramped field or an ac field or a combination of the two. The magnetic bias is supplied either by coating each wire with a hard magnetic material which is magnetized or by using magnetized hard magnetic wires or foil strips in proximity to the amorphous wires. Each wire switches at a different value of the external interrogation field due to the differences in the magnetic bias field acting on each wire.

SUMMARY OF THE INVENTION

The system of the present invention includes an RFID tag combined with a magnetic EAS tag in a hard or soft package. Such hard or soft packages are operably configured for ready attachment to a chattel. The conducting elements of the RFID tag such as the antenna or the parasitic elements used to tune the antenna characteristics may be wholly or partially made from a non-linear magnetic material which produces a large signal in a magnetic EAS detection field. The non-linear magnetic material may be coated or electroplated or electrolessly plated with a good electrical conductor to enhance the antenna characteristics of the RFID tag. The non-linear magnetic material may be advantageously connected to dielectric material used to support and/or encapsulate the antenna and electronic components of the RFID tag.

BRIEF DESCRIPTION OF THE DRAWINGS

FIGS. 2A, 2B, and 2C are partial cross-sectional isometric views of embodiments of a soft combination tags of the present invention, wherein FIG. 2A illustrates a meander dipole antenna; FIG. 2B illustrates a meander dipole with an impedance adjustment element (loading bar), and FIG. 2C is a simple dipole having two impedance adjustment elements (loading bars);

DETAILED DESCRIPTION OF THE INVENTION

Figure 5A:
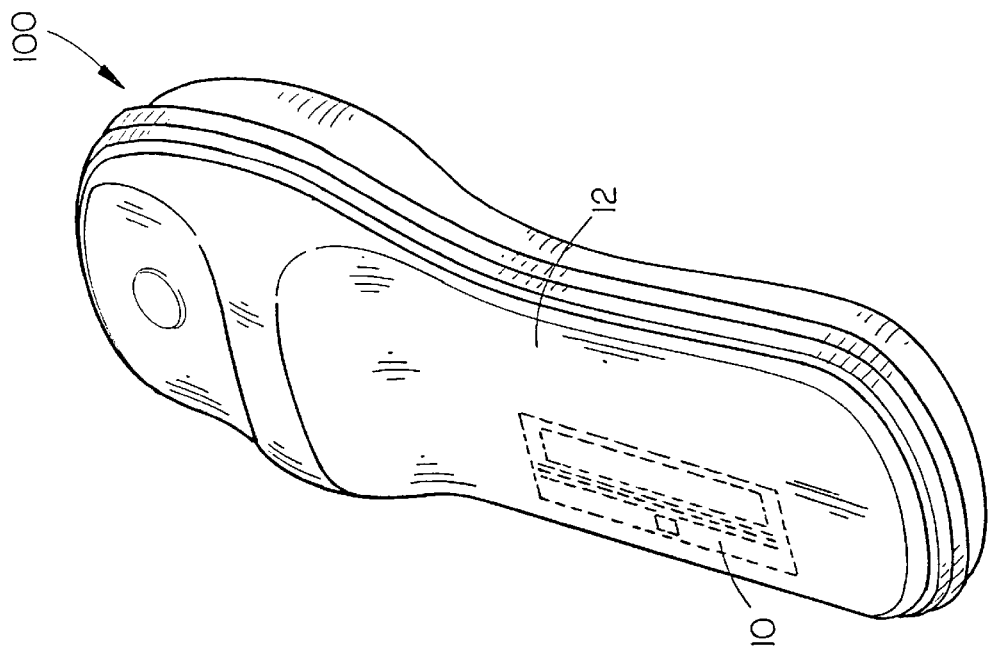
FIGS. 5A, 5B, and 5C, partial hidden isometric views of various hard tag embodiments of the present invention.
Figure 1:
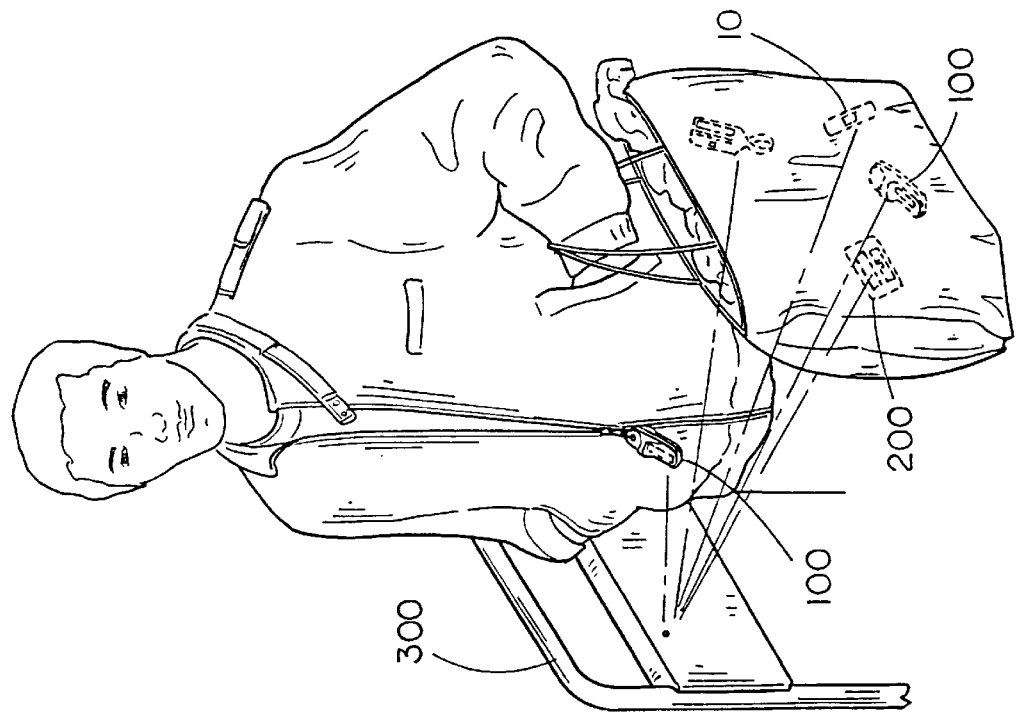
FIG. 1 is an isometric view of an embodiment of the system of the present invention illustrating both hard and soft embodiments of combination tags.

FIG. 1 is an isometric drawing illustrating several aspects of the present invention. For example, a consumer or the like may be monitored in a shopping environment such that information regarding a consumer's shopping habits or customs, the effectiveness of store displays, and the like may be determined. This may be accomplished most readily by utilizing, for example, a consumer wearable hard combination tag 100. As a consumer passes a check-point (or the like) 300 consumer items may be identified as being associated with a particular consumer product.

Additionally, FIG. 1 may also illustrate another use of an embodiment of the present system. For example, the system may be utilized in a loss prevention system. Such that a check-point 300 may be utilized to read both hard 100 and soft 200 combination tags identifying articles to be protected. The check-point 300 may read the RFID 10 memory of the combination tags (100, 200, 200' of FIG. 1) so as to debit a purchasers account (or the like). Further, the check-point 300 may also determine whether all items in possession of a consumer have been purchased by reading the EAS portion 12 of the combination tags (100, 200, 200' of FIG. 1).

Figure 2A:
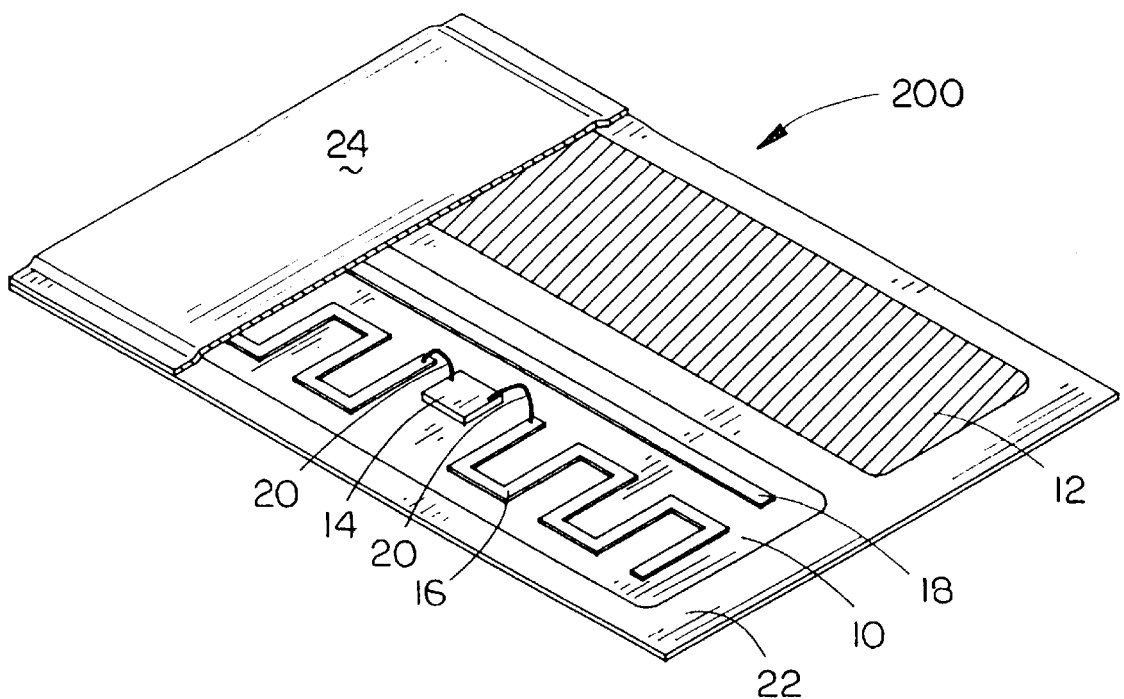

FIGS. 2A, 2B, 2C, and 2D illustrate soft (at least partially flexible) combination tags 200 of the system of the present invention. FIG. 2A illustrates the elements of an exemplary embodiment of such a tag. In this embodiment a single integrated circuit 14 contains the radio, memory and power supply. The radio chip 14 is wire-bonded 20 to a dipole (folded) antenna 16 (an antenna tuning element 18 may also be included). These elements are attached to a flexible substrate 22 which also secures an EAS (non-linear magnetic material) 12. A protective cover 24 is then provided to protect these elements.

Figure 2B:
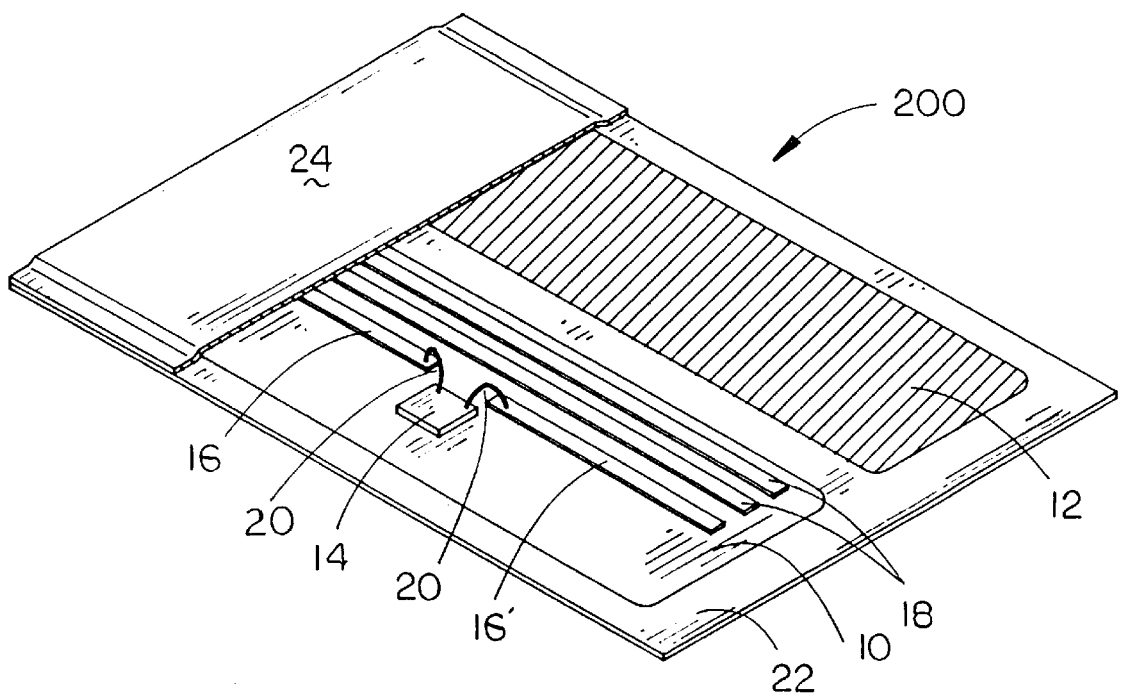
Figure 2C:
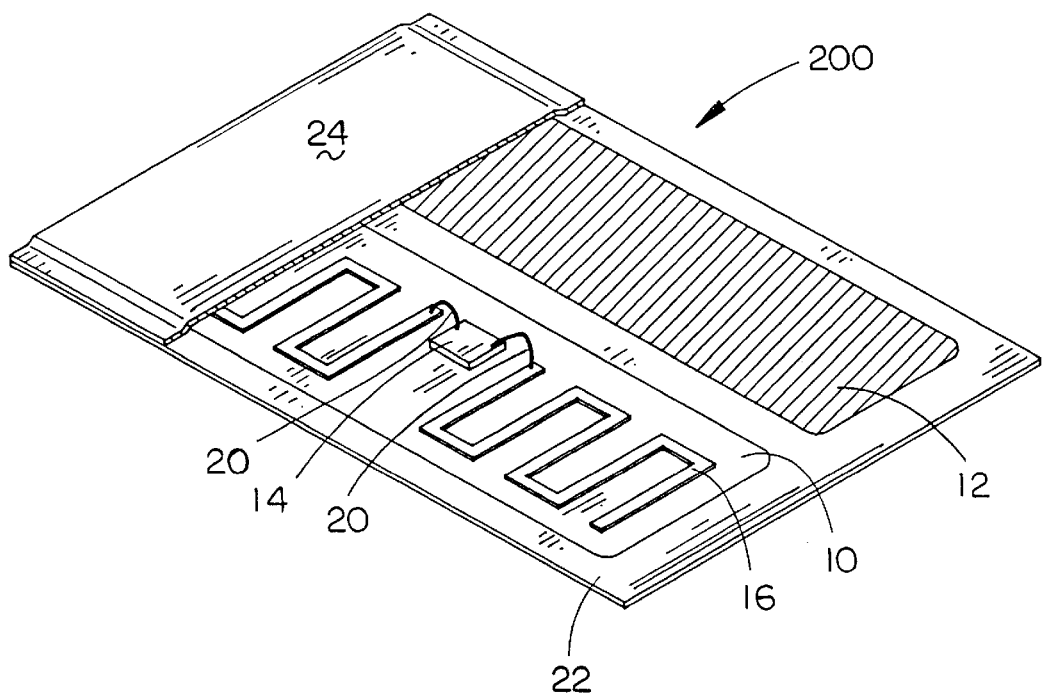
Figure 2D:
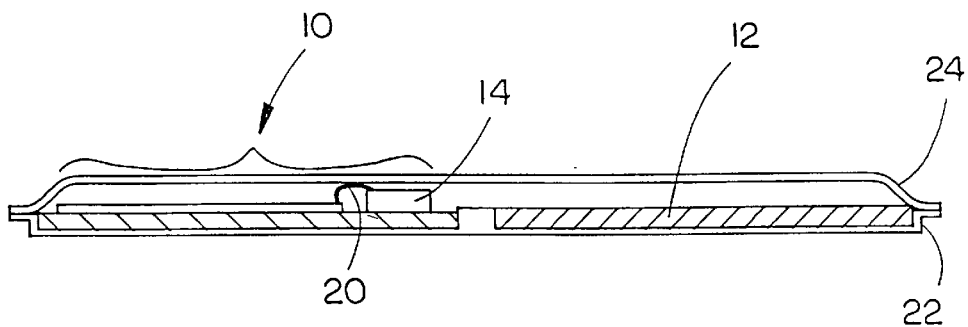
FIG. 2D is a side elevational cross-sectional view generally illustrating the embodiments of FIGS. 2A, 2B, and 2C (the loading bar(s) are not shown and a dipole antenna is illustrated) of an embodiment of the present invention.
Figure 3:
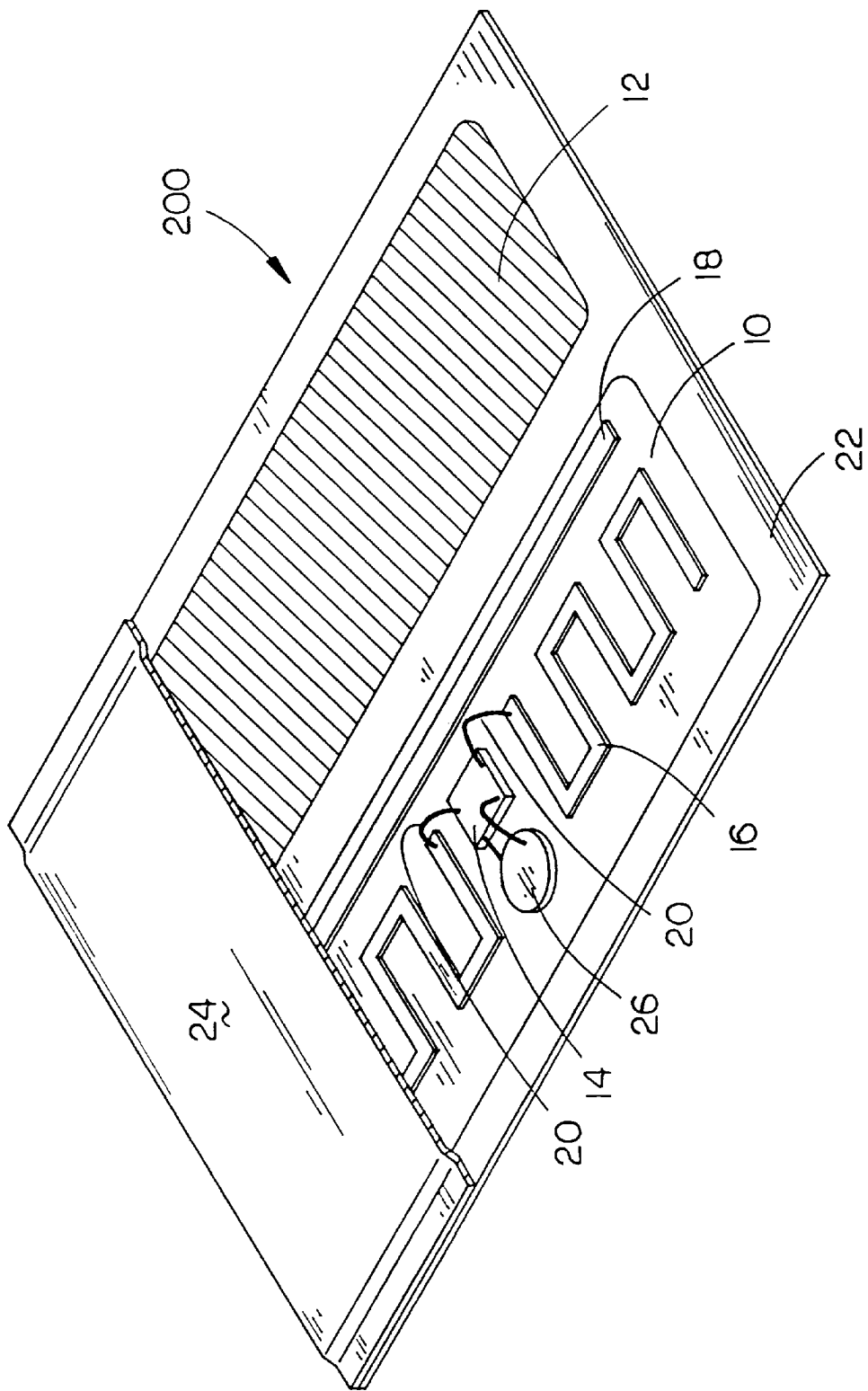
FIG. 3 is a partial cross-sectional isometric view of a soft combination tag having a powered RFID transponder.
Figure 4A:
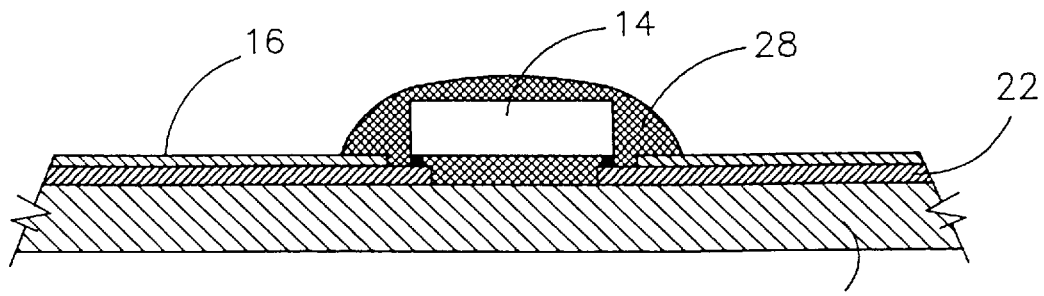
FIGS. 4A, 4B, 4C, 4D, and 4E are partial cross-sectional views illustrating various chip placement and chip connection embodiments of the present invention.
Figure 4B:
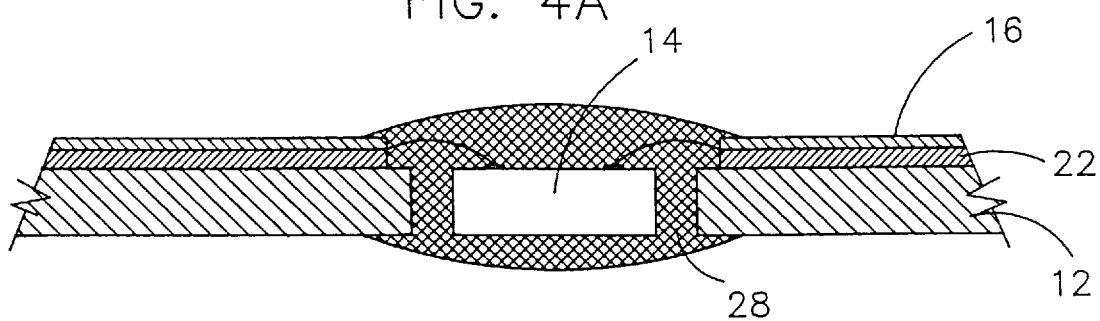
Figure 4C:
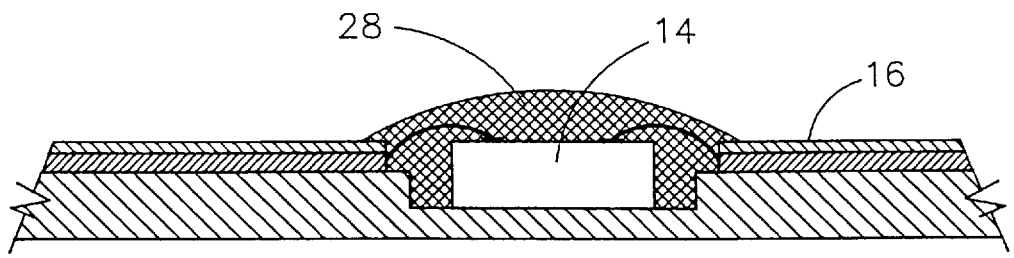
Figure 4D:
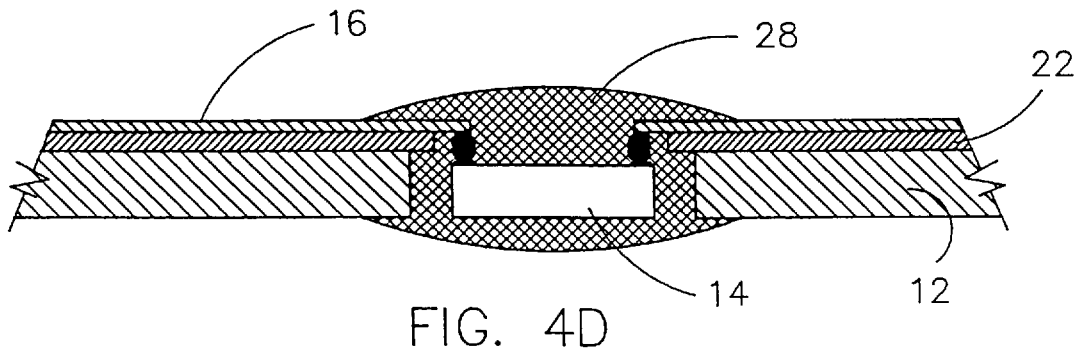
Figure 4E:
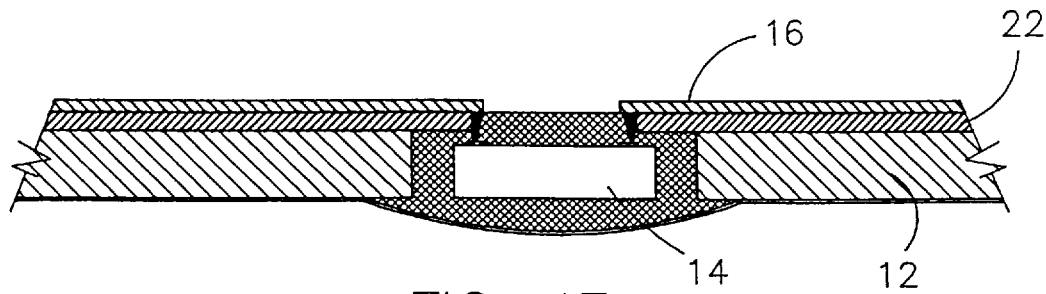
Figure 5B:
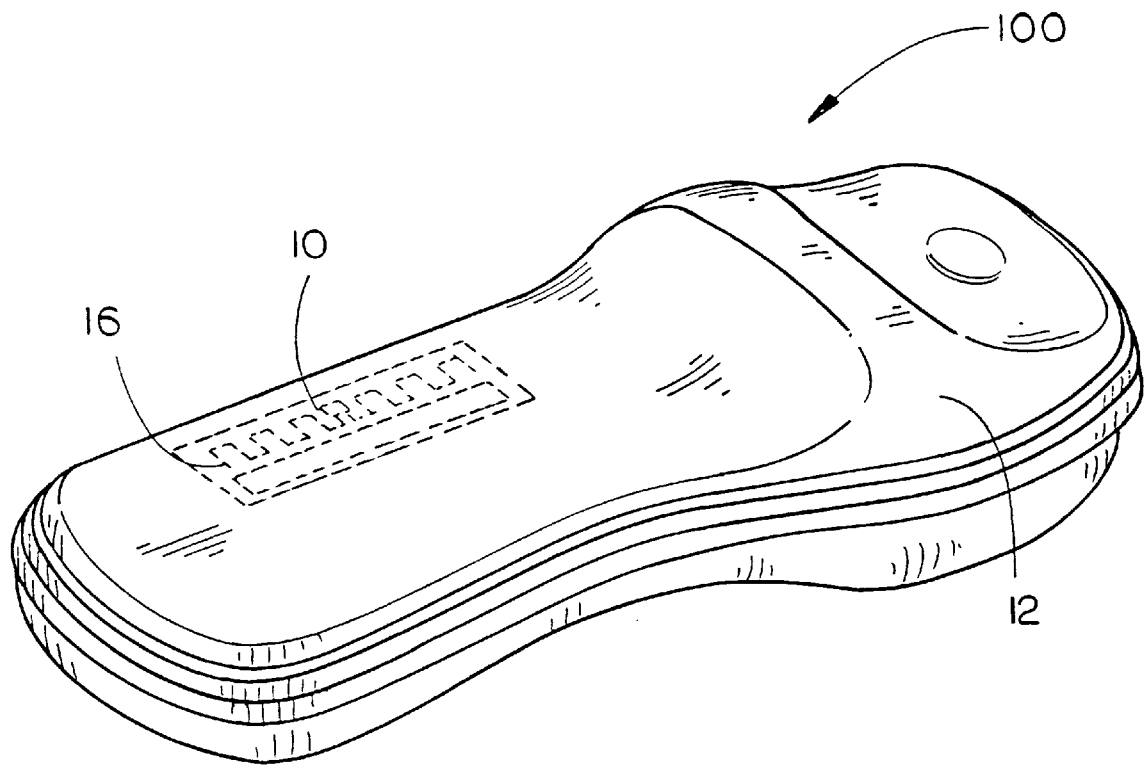
Figure 5C:
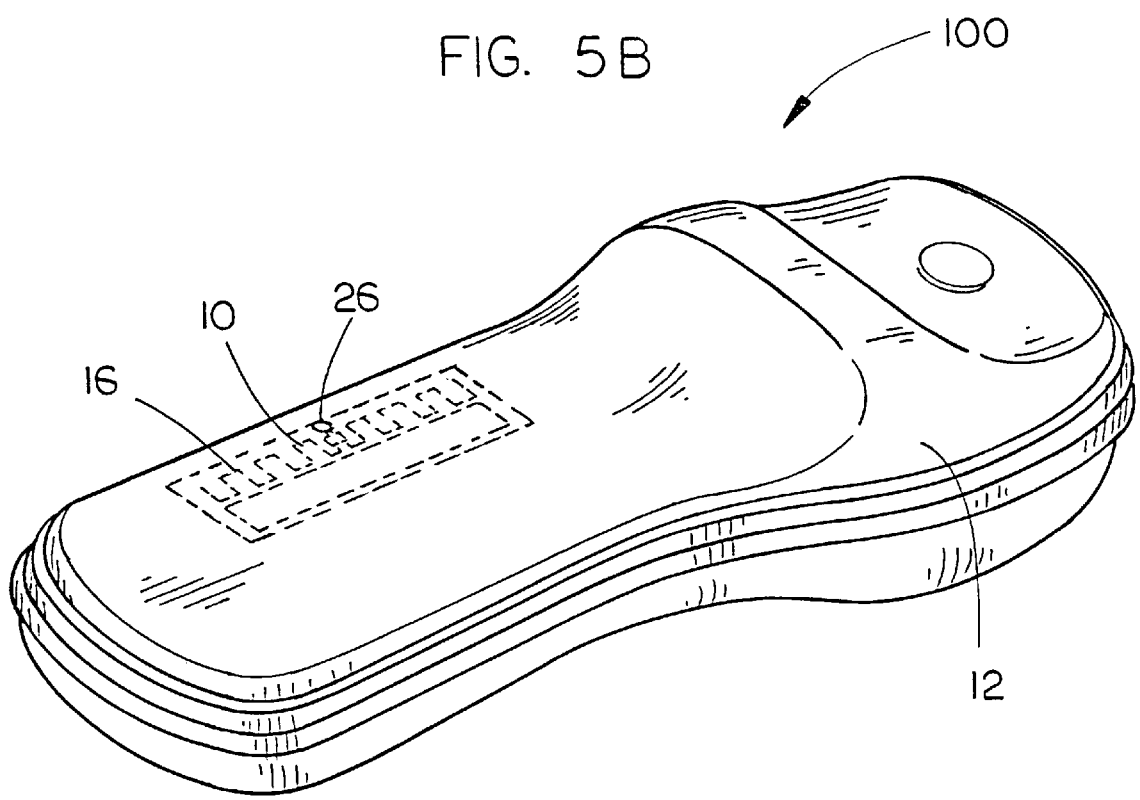
Figure 5D:
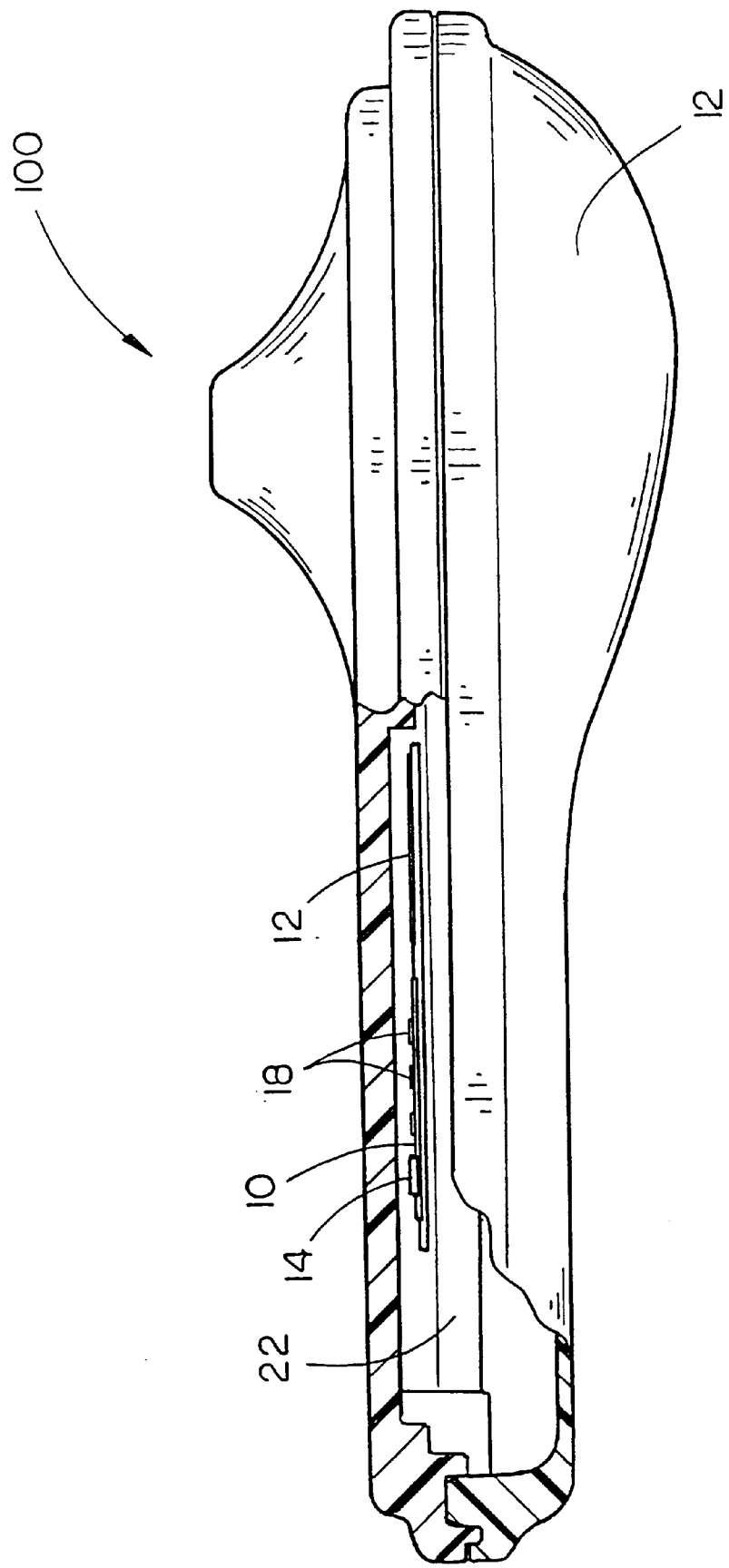
FIG. 5D is a partial cross-sectional elevation view generally illustrating the embodiments of FIGS. 5A, 5B, and 5C.

FIG. 2B illustrates a soft combination tag 200 wherein the RFID portion utilizes a dipole antenna 16' and two antenna tuning elements 18. FIG. 2C illustrates a soft combination tag 200 wherein the antenna 16 does not include any antenna tuning elements 18. FIG. 2D Illustrates in elevation a radio chip 14 surface mounted to the substrate 22. FIG. 3 illustrates a soft combination tag 200" having a powered RFID portion. Such a tag may be powered by an electrochemical power cell 26. FIGS. 4A, 4B, 4C, 4D, and 4E illustrate is cross-sectional elevation other preferred chip 14 attachment methods. FIGS. 5A, 5B, 5C, and 5D illustrate an exemplary hard combination tag 100.

Figure 6:
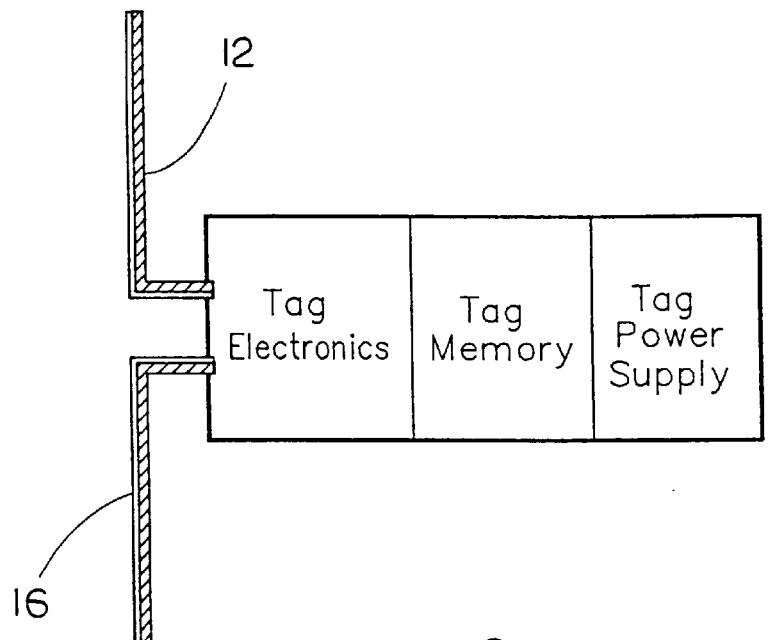
FIG. 6 shows a block diagram of an RF tag of present invention.

FIG. 6 shows block diagram of an RF tag having tag electronics, a tag memory, and a tag power supply connected to a tag antenna 18. The tag antenna 18 is shown in this embodiment made from a non-linear magnetic material 12. Such non-linear magnetic materials may have electrical conductivity insufficient for high quality antennas, and an alternative most preferred embodiment is to coat the non-linear magnetic material with a good electrical conducting material such as copper, gold, or a conducting polymer. The conducting material need only be as thick as the skin depth of the high frequency RF signals sent to the RFID tag 10 (FIG. 1). Such conducting material may be coated on the non-linear magnetic material 12 by coating processes well known in the art such as evaporation, electroplating, or electroless plating.

Figure 7:
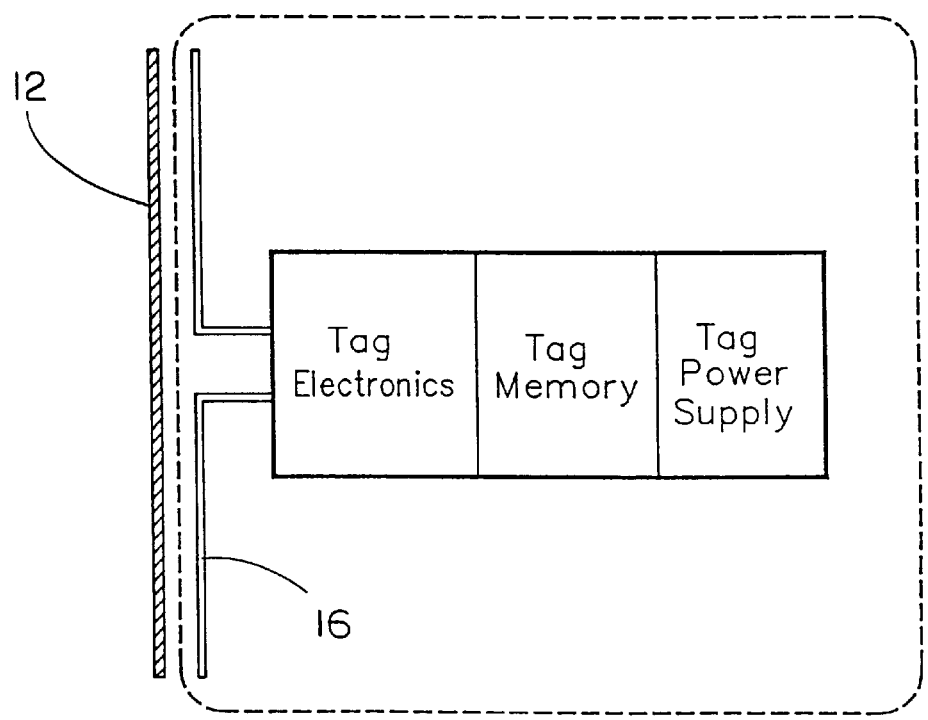
FIG. 7 shows a block diagram of an RFID transponder (tag)

FIG. 7 shows a sketch of an RFID tag 10 having a tag antenna 16 electrically and spatially separated from a non-linear magnetic material 12. In the embodiment shown, the non-linear material is shown as a wire placed as a parasitic element to a dipole antenna 16 of the RFID tag 10. A preferred embodiment in this case also is to have the non-linear material 12 coated with an electrically conducting material if the electrical resistivity of the non-linear material 12 is too high.

Figure 8:
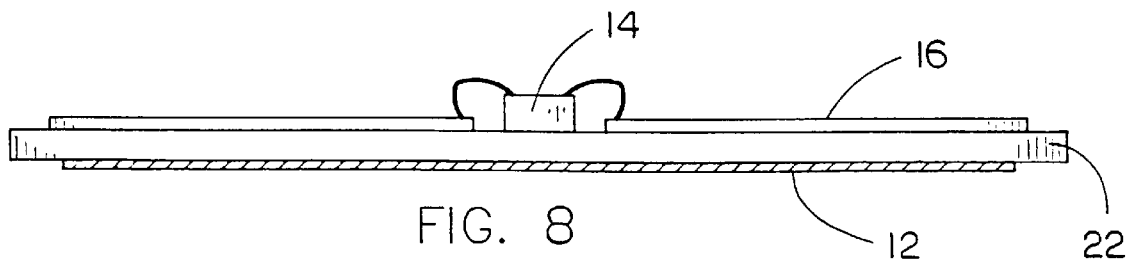
FIG. 8 shows an elevation sketch of a physical layout for the sketch of FIG. 7.

FIG. 8 shows an elevation sketch of a physical layout for the sketch of FIG. 7. The dipole antenna 16 is connected to a silicon chip 14 containing the tag memory, tag electronics, and tag power supply by wires. The antenna 16 and the chip 14 are mounted on a dielectric material 22. The non-linear material 12 is mounted on the opposite side of the dielectric material 22 to the antenna 16 and chip 14. In this embodiment, the non-linear material 12 may once again be coated with a good electrical conductor.

Figure 9:
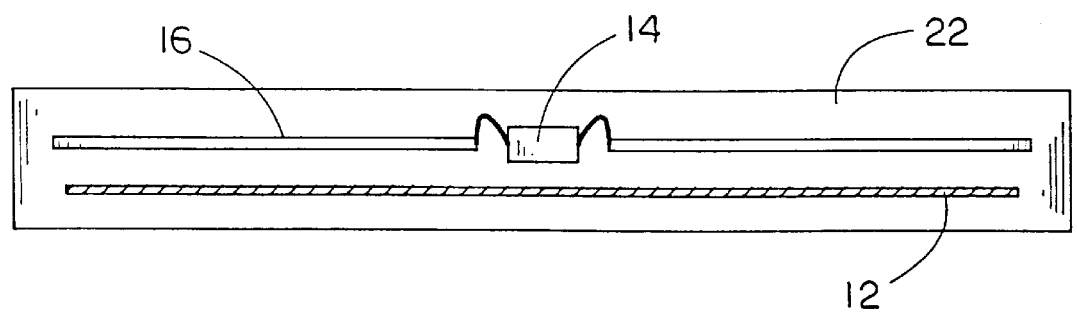
FIG. 9 shows an alternative arrangement of FIG. 7.

FIG. 9 shows an alternative arrangement of FIG. 7. The silicon chip 14, the antenna 16, and the non-linear material 12 are all mounted on the same side of a supporting structure made of dielectric 22. In this embodiment, the non-linear material 12 may once again preferrably be coated with a good electrical conductor.

Figure 10:
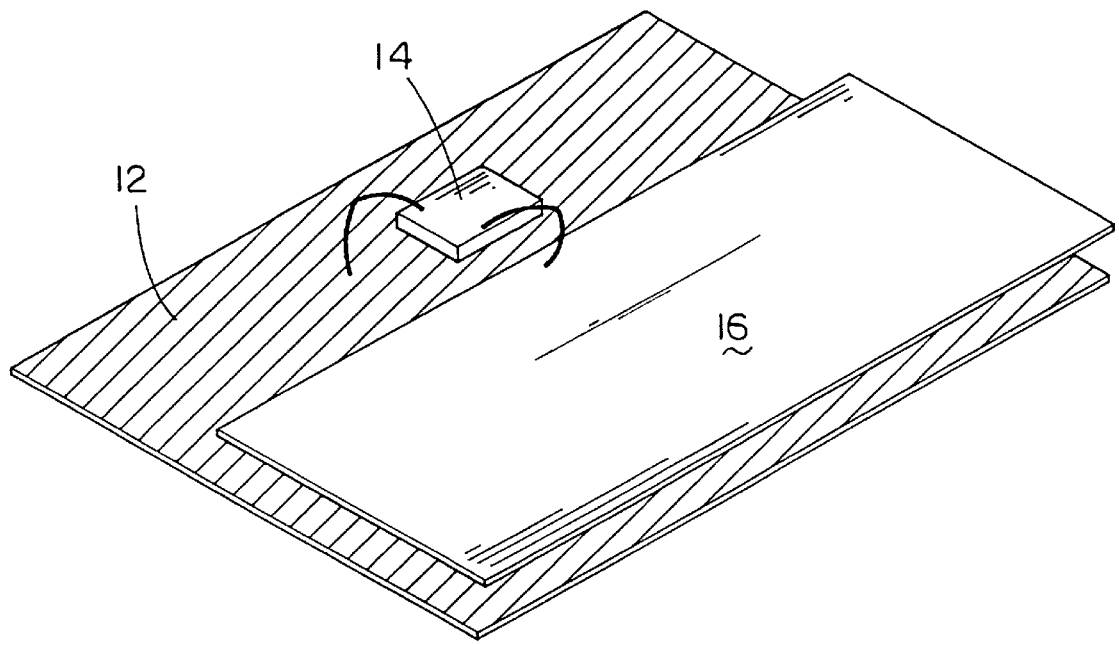
FIG. 10 shows perspective sketch of a preferred alternative antenna arrangement for an RFID tag.

FIG. 10 shows perspective sketch of a preferred alternative antenna arrangement for an RFID tag. A silicon chip 14 is electrically attached to an electrically conducting patch antenna 16. The silicon chip is also electrically attached to an electrically conducting ground plane, which is spatially separated from the patch antenna by a dielectric material (not shown). In the embodiment shown in FIG. 10, the electrically conducting ground plane is made from non-linear magnetic material 12. In this embodiment, the non-linear material 12 may once again preferrably be coated with a good electrical conductor.

Figure 11:
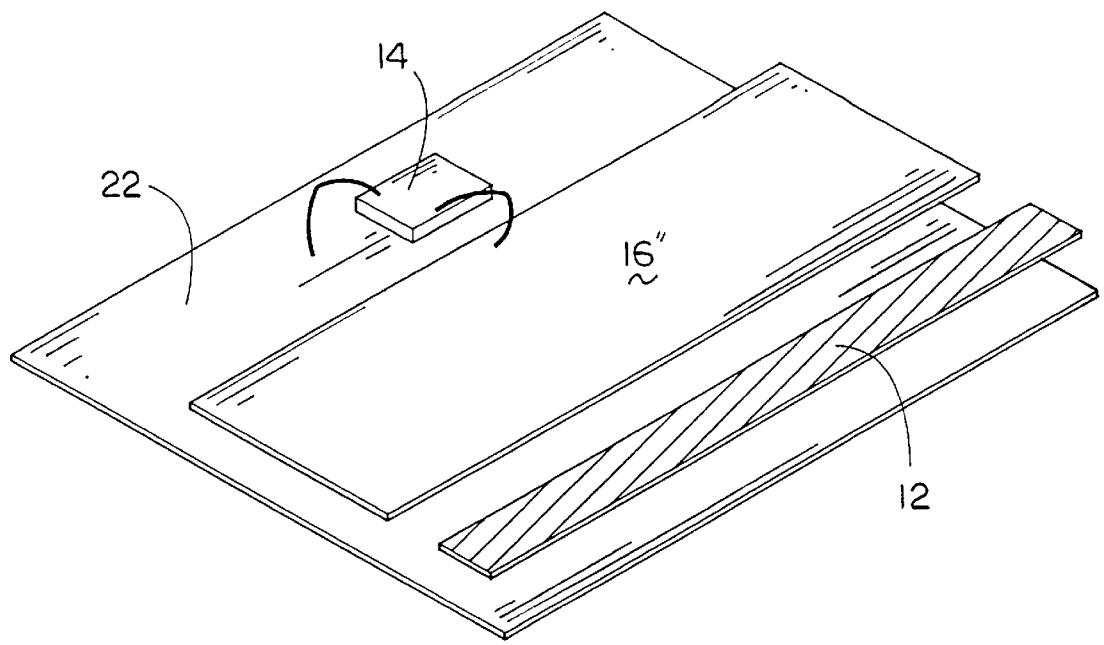
FIG. 11 shows a perspective sketch of a patch antenna mounted coplanar with a non-linear magnetic material.

FIG. 11 shows a perspective sketch of a patch antenna mounted coplanar with a non-linear magnetic material 12. The magnetic material may be in the form of a wire or in the form of a sheet as shown in the diagram.

Figure 12:
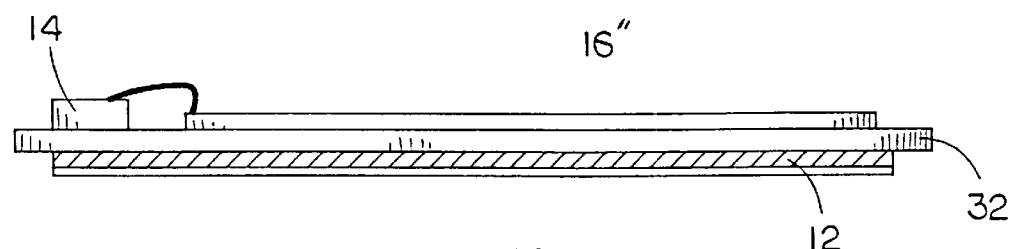
FIG. 12 shows an elevation sketch of the apparatus of FIG. 10.

FIG. 12 shows an elevation sketch of the apparatus of FIG. 10. In this case, the dielectric material 32 supporting the patch antenna, the chip 14, and the ground plane. The alternative embodiment having a conducting material coating the non-linear material is also shown. In this case, the material of the patch antenna 16 is alternatively made of a non-linear magnetic material instead of the ground plane. Once again, the non-linear material 12 may once again preferably be coated with a good electrical conductor.

Figure 13:
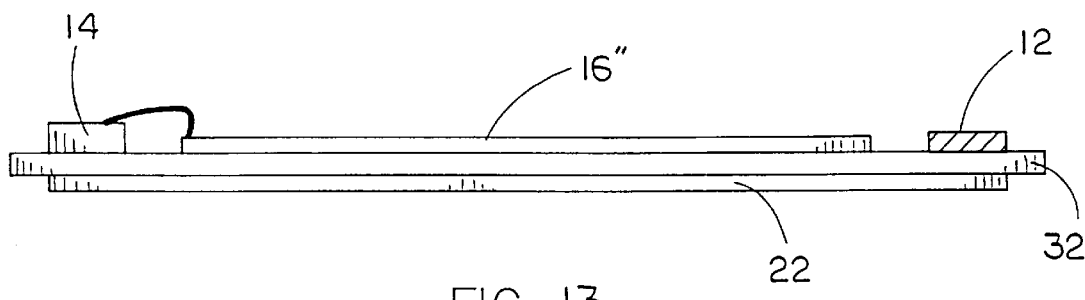
FIG. 13 shows an elevation sketch of the apparatus of FIG. 11 showing the supporting dielectric material.

FIG. 13 shows an elevation sketch of the apparatus of FIG. 11 showing the supporting dielectric material.

What is claimed is:

1. A chattel identification unit, comprising:

a radio frequency (RF) transponder (tag), the RF tag comprising a tag antenna, tag electronics for storing information in a codable and recordable memory and for communicating information to a base station by modulating reflectance characteristics of the tag antenna, and a tag power supply;

a non-linear magnetic material operably associated with said RF tag, the non-linear magnetic material generating a varying electronic article surveillance magnetic field when the non-linear magnetic material is in a magnetic field the non-linear magnetic material providing at least a portion of the tag antenna; and a protective housing for protectively shielding said RF tag and said non-linear magnetic material from environmental effects.

2. The chattel identification unit of claim 1, wherein said magnetic field is sinusoidally varying with a frequency $f_0$, the electronic article surveillance magnetic field varying with a frequency having higher harmonics of $f_0$.

3. The chattel identification unit of claim 1, wherein the tag antenna comprises the non-linear magnetic material.

4. The chattel identification unit of claim 3, wherein the tag antenna comprises a first wire electrically connected to a semiconductor device incorporating the tag electronics.

5. The chattel identification unit of claim 4, wherein the first wire comprises non-linear magnetic material.

6. The chattel identification unit of claim 5, wherein the non-linear magnetic material is coated with an electrically conducting material.

7. The chattel identification unit of claim 6, wherein the non-linear magnetic material is coated with an electrically conducting material.

8. The chattel identification unit of claim 4, wherein a second wire cooperates with the first wire to form the tag antenna, the second wire comprising non-linear magnetic material.

9. The chattel identification unit of claim 4, wherein the tag antenna comprises a patch antenna electrically connected to a semiconductor device incorporating the tag electronics, the patch antenna having a ground plane.

10. The chattel identification unit of claim 9, wherein the non-linear magnetic material is coated with an electrically conducting material.

11. The chattel identification unit of claim 1, wherein the tag antenna comprises a patch antenna formed by a dielectric sheet having a first side and a second side, a first electrically conducting material attached to the first side, and a second electrically conducting material attached to the second side, wherein a semiconductor device incorporating the tag electronics is electrically connected to the first electrically conducting material and the second electrically conducting material, and wherein the non-linear magnetic material is attached to the dielectric sheet.

12. The chattel identification unit of claim 1, wherein the tag antenna comprises an electrically conducting wire antenna electrically connected to a semiconductor device incorporating the tag electronics, wherein the tag antenna and the semiconductor device are attached to a dielectric material and wherein the non-linear magnetic material is attached to the dielectric material.

13. The chattel identification unit of claim 1, further comprising an article attachment apparatus for attaching said package to a chattel.

14. The chattel identification unit of claim 1 wherein said package is flexible.

15. A chattel control system, comprising:

(a) at least one chattel identification unit, said chattel identification unit including:

(i) a radio frequency (RF) transponder (tag), the RF tag comprising a tag antenna, tag electronics for storing information in a codable and recordable memory and for communicating information to a base station by modulating reflectance characteristics of the tag antenna, and a tag power supply;

(ii) a non-linear magnetic material operably associated with said RF tag, the non-linear magnetic material generating a varying electronic article surveillance magnetic field when the non-linear magnetic material is in a magnetic field, the non-linear magnetic material providing at least a portion of the tag antenna; and (iii) a protective housing for protectively shielding said RF tag and said non-linear magnetic material from environmental effects;

(b) at least one reader for reading information stored on said at least one chattel identification unit.

16. A chattel identification unit, comprising:

a radio frequency (RF) transponder comprising an integrated circuit package containing at least electronic circuitry and memory, and an antenna operatively coupled to the integrated circuit package;

a non-linear magnetic material providing a varying electronic article surveillance magnetic field in response to an interrogating magnetic field, the non-linear magnetic material providing at least a portion of the tag antenna; and a protective housing enclosing said RF tag and said non-linear magnetic material to protect against environmental effects.

17. The chattel identification unit of claim 16, wherein the non-linear magnetic material further comprises an electrically conducting material layer affixed thereto.

18. The chattel identification unit of claim 16, wherein said non-linear magnetic material further comprises a parasitic element of the antenna.

19. The chattel identification unit of claim 16, wherein said non-linear magnetic material further comprises a tuning element of the antenna.

20. The chattel identification unit of claim 16, wherein said RF tag further comprises a power source.

* * * * *